(12) United States Patent
Taylor

(10) Patent No.: US 7,317,351 B2
(45) Date of Patent: Jan. 8, 2008

(54) LOW NOISE AMPLIFIER

(75) Inventor: Stewart S. Taylor, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 164 days.

(21) Appl. No.: 11/204,966

(22) Filed: Aug. 16, 2005

(65) Prior Publication Data

US 2007/0040609 A1 Feb. 22, 2007

(51) Int. Cl.
*H03F 1/36* (2006.01)
(52) U.S. Cl. .......................... 330/85; 330/110
(58) Field of Classification Search ............... None
See application file for complete search history.

(56) References Cited

U.S. PATENT DOCUMENTS

| | | | | |
|---|---|---|---|---|
| 3,825,854 A * | 7/1974 | Pichal | ......................... | 330/149 |
| 5,504,456 A * | 4/1996 | Coleman | ..................... | 330/107 |
| 5,781,068 A * | 7/1998 | Takita | ........................ | 330/85 |
| 6,404,282 B2 * | 6/2002 | Kikuchi et al. | ............... | 330/86 |
| 6,580,317 B1 * | 6/2003 | Oppelt | ......................... | 330/85 |
| 6,600,371 B2 * | 7/2003 | Cali | ............................ | 330/254 |
| 6,646,463 B1 * | 11/2003 | Hariton | ....................... | 326/30 |
| 6,838,936 B2 * | 1/2005 | Oppelt | ......................... | 330/110 |
| 2006/0238254 A1 * | 10/2006 | Gilbert et al. | .............. | 330/254 |

* cited by examiner

*Primary Examiner*—Robert Pascal
*Assistant Examiner*—Krista M Flanagan
(74) *Attorney, Agent, or Firm*—Lee & Hayes, PLLC

(57) ABSTRACT

A low noise amplifier (LNA) is discussed. In implementations, a LNA may include a feedback section coupled to a transistor. The feedback section may have a resistive portion including a buffer and a resistor. A capacitor may be connected in parallel with the resistor. In additional implementations, an integrated circuit may include a second transistor connected to the drain of the first transistor. A feedback section may be coupled across the first and second transistors. The feedback section may include a buffer, a resistor and a capacitor connected in series, so that the terminal of the buffer is connected to the drain of the second transistor while the terminal of the resistor is connected to a source on the first transistor.

25 Claims, 6 Drawing Sheets

LOW NOISE AMPLIFIER

BACKGROUND

Low Noise Amplifiers (LNAs) are typically used in communication transceivers for the amplification of weak electrical signals. Two of the main concerns associated with the design of amplifiers utilized for low noise radio frequency (RF) amplification are: (1) minimization of noise added to an electrical signal processed by the amplifier; and (2) achieving maximum power transfer between a source producing the electrical signal and the amplifier.

The noise added to a signal received by an amplifier results in a degradation of the signal-to-noise ratio (S/N) at an output of the amplifier. A figure of merit for the amount of noise added by the amplifier is the ratio of the S/N at an input of the amplifier to the S/N at the output of the amplifier. This ratio is commonly referred to as a Noise Factor (F) of the amplifier, and is used to calculate a Noise Figure (NF) of the amplifier.

To achieve maximum power transfer between a source and an amplifier, the input impedance of the amplifier should equal a complex conjugate of the source output impedance. In the case where the output impedance of the source is real, the input impedance of the amplifier should also be real. Nonetheless, for maximum power transfer between the source and the amplifier, the output impedance of the source and the input impedance of the amplifier should be equal. This is commonly referred to as impedance matching or power matching.

FIG. 1 illustrates a conventional common-source LNA 100. The LNA 100 includes a transistor 102 having a drain applied with a supply voltage Vdd through a first inductor 104. An input RF signal (RF In) is applied to a gate of the transistor 102 through a second inductor 106, while an RF signal (RF Out) output from the LNA 100 is taken from the drain of the transistor 102. The gate of the transistor 102 is further connected via a resistor 107 to a diode-connected transistor 108 that forms a current mirror circuit with transistor 102. A source of the transistor 102 is connected to a ground 110 via a third inductor 112. The current mirror circuit 108 is also coupled to ground 110 via the third inductor 112. This arrangement establishes a predetermined bias current in transistor 102. Operation of the illustrated LNA 100 is well known by those skilled in the art, where the input RF signal is amplified according to the characteristics of transistor 102 and the matching networks, including three inductors 104, 106 and 112

FIG. 2 illustrates a conventional common-gate LNA 200. The LNA 200 includes a first inductor 202 having a first terminal that receives an input RF signal (RF In) and a second terminal connected to a ground 204. A capacitor 206 is connected in parallel between the first terminal of the first inductor 202 and the ground 204. A second inductor 208 is connected between a drain of a transistor 210 and a supply voltage Vdd. The interconnection between the second inductor 208 and the transistor 210 forms an output node for supplying an output RF signal (RF Out). Characteristic of a common-gate LNA, the gate of the transistor 210 is connected to a bias voltage source 212. Operation of the illustrated common-gate LNA 200 is also well known by those skilled in the art.

When an LNA is manufactured, such as the LNAs 100 and 200 illustrated in FIGS. 1 and 2, respectfully, the active components of the amplifier are typically installed on-chip. The processes used to manufacture an LNA may include Complementary Metal Oxide Semiconductor (CMOS) techniques, which makes the LNA particularly attractive for use in portable electronic devices.

Unfortunately, on-chip inductors used in conjunction with LNAs may have poor performance. Further, the use of on-chip inductors increases chip area of the LNAs. This usually increases cost, particularly for multi-standard products.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical items.

DETAILED DESCRIPTION

Low Noise Amplifiers (LNAs) can be found in many different electronic devices. LNAs are used, for example, in mobile communication devices, such as cellular phones, portable digital assistants (PDAs), wireless chipsets for portable computers, and so forth.

This disclosure is directed to common-gate LNAs. Such LNAs can be used in a variety of radios requiring a low noise figure, high linearity, and low sensitivity. Such LNAs can be used for various applications, including ultra wide band (UWB), OFDM(A), CDMA, TDMA, etc. based communication devices implemented in networking architectures including, but not limited to personal area networks (PAN), local area networks (LAN), wide or metropolitan area networks (W/MAN), cellular/wireless networks, and the like. The common-gate LNAs described below may be fabricated using CMOS technologies. The LNAs may also be fabricated with other known technologies, such as bi-polar transistors. Additionally, the LNAs do not employ any inductors, thereby reducing die area requirements.

The following disclosure is organized to describe initially various implementations of common-gate LNAs. An example radio system employing one or more of the LNAs is then described, followed by a discussion of procedures which may be performed to provide low noise amplification of an electrical signal.

Low Noise Amplifiers

Figure 1:
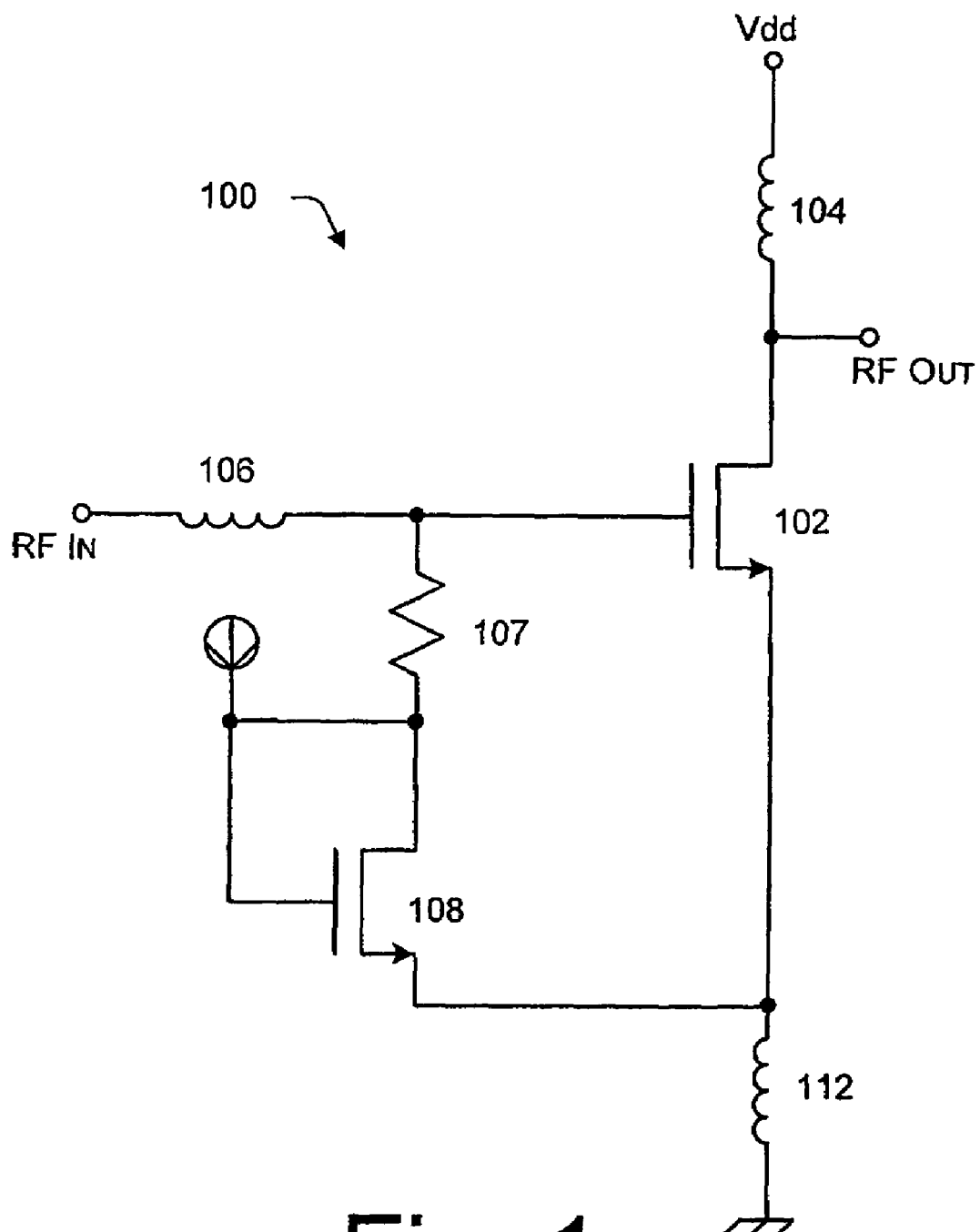
FIG. 1 is a circuit diagram illustrating a conventional common-source Low Noise Amplifier (LNA) circuit.
Figure 2:
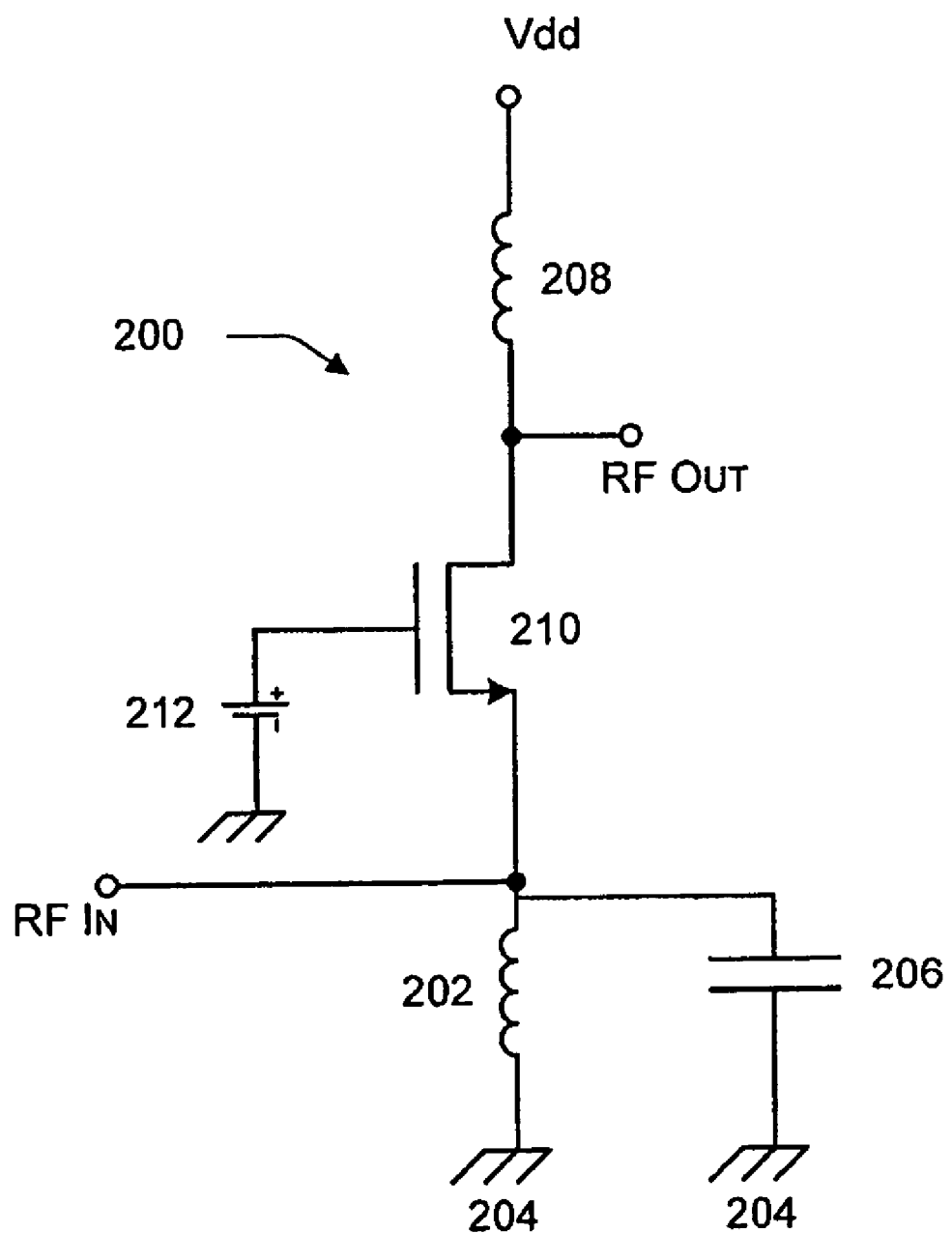
FIG. 2 is a circuit diagram illustrating a conventional common-gate LNA circuit.
Figure 3:
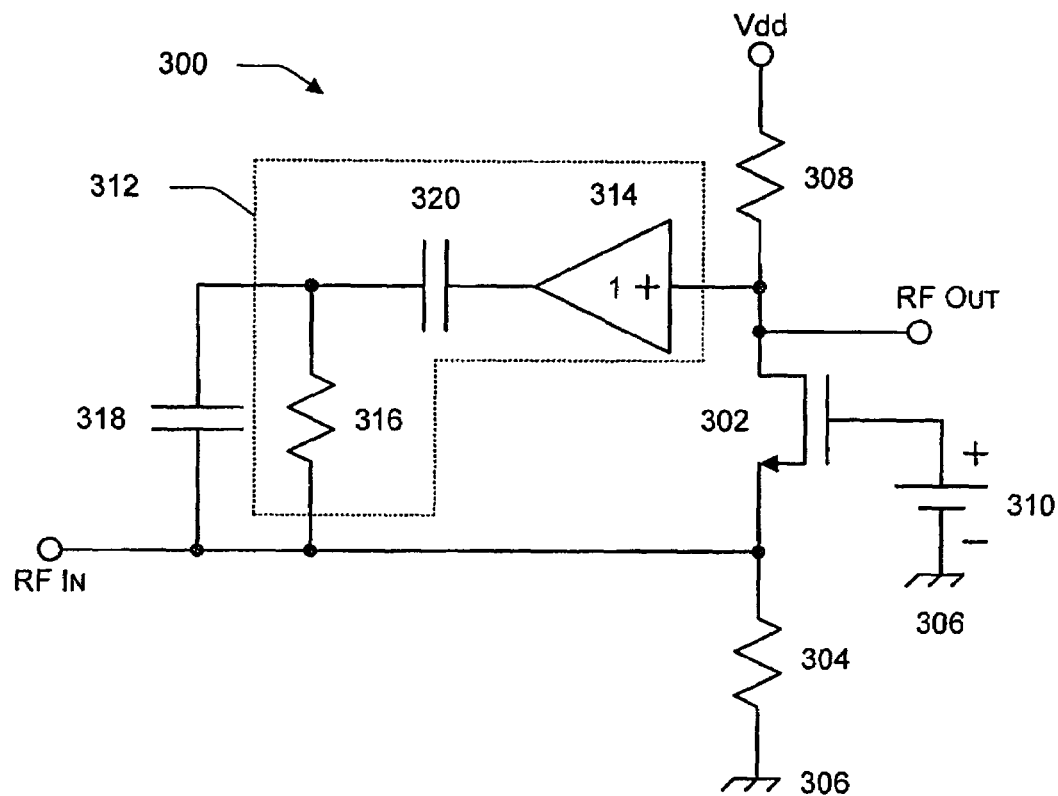
FIG. 3 is a circuit diagram illustrating a first implementation of a common-gate LNA circuit.

FIG. 3 illustrates a first implementation of a common-gate Low Noise Amplifier (LNA) circuit 300. The common-gate LNA 300 may be implemented and fabricated as an integrated circuit using CMOS techniques, or other related implementation and fabrication techniques.

The common-gate LNA 300 includes a transistor 302 having a gate, drain and source. An input RF signal (RF In) is applied to the source of the transistor 302 and an output RF signal (RF Out) is taken from the drain of the transistor 302. A resistor 304 is connected between the source of the transistor 302 and ground 306. Another resistor 308 is connected between a voltage source Vdd and the drain of the transistor 302. A biasing voltage source 310 is connected to the gate of the transistor 302.

The common-gate LNA 300 is further equipped with a feedback section 312 connected between the drain and the source of the transistor 302. The feedback section 312 provides positive resistive feedback for high voltage gain and a low Noise Figure (NF) for specific frequencies of operation. Furthermore, the common-gate LNA 300 provides improved linearity and gain controllability. The LNA 300 is also formed without the use of inductors.

The feedback section 312 of the common-gate LNA 300 includes a buffer 314 and a resistor 316. The buffer 314 and resistor 316 embody a resistive portion of the feedback section 312. The buffer 314 and a resistor 316 also enable the common-gate LNA 300 to provide substantially high gain (e.g., greater than 20 dB), and very reasonable input matching characteristics. The RF out is shown taken from the drain of the transistor 302 and may be connected to a buffer of a next stage. Alternatively, RF out may be taken from the output of the buffer 314 and connected to the next stage.

A capacitor 318 may optionally be placed in parallel with the resistor 316 of the restive portion of the feedback section 312. The capacitor 318 is used to compensate for any undesirable input capacitance associated with the transistor 302. The addition of capacitor 318 allows adjustment of the input impedance, which improves reflection characteristics at higher frequencies (e.g., 5 GHz).

The feedback section 312 may also include a DC blocking component. In one implementation, the DC block component is implemented as a capacitor 320 having a first terminal connected to the buffer 314 and a second terminal connected to the resistor 316. In other implementations, a combination of one or more other devices may be used to implement the DC blocking component of the feedback section 312. In another implementation, the buffer 314 is omitted and the capacitor 320 is coupled directly to the drain of transistor 302. In still another implementation, the capacitor 320 is omitted and a level shifting means is connected between the buffer 314 and the resistor 316. Suitable level shifting means are known to those skilled in the art.

The input impedance of the common-gate LNA 300 is expressed by the following approximate relationship:

$$R_{in} \cong \frac{1}{g_m = \frac{g_m R_L - 1}{R_f}} \cong \frac{1}{g_m\left(1 - \frac{R_L}{R_f}\right)},$$

where $R_{in}$ is the input impedance seen from the input of the common-gate LNA 300, $R_L$ is the resistor 308, $R_f$ is the resistor 316 and $g_m$ is the transconductance of transistor 302. Advantageously, the $R_{in}$ can be set to 50Ω by choosing $$g_m\left(1 - \frac{R_L}{R_f}\right) \cong 50\Omega.$$

For this example, the ratio $$\frac{R_L}{R_f} \cong 0.6.$$

While one suitable ratio is approximately 0.6, it is advantageous to maintain the value of the indicated ratio in the range of 0.4 to 0.8.

Typically, buffer 314 is a source-follower circuit with a voltage gain of 0.7 to 1. Implementing the common-gate LNA 300 in the described manner will provide a low NF with high linearity and low sensitivity. Moreover, unlike known conventional LNA configurations, the common-gate LNA 300 illustrated in FIG. 3 provides input matching without sacrificing the NF and linearity, and eliminates the use of inductors.

In another implementation, the LNA 300 may employ a second buffer connected at the drain of the transistor 302 and leading to another amplifying stage.

Figure 4:
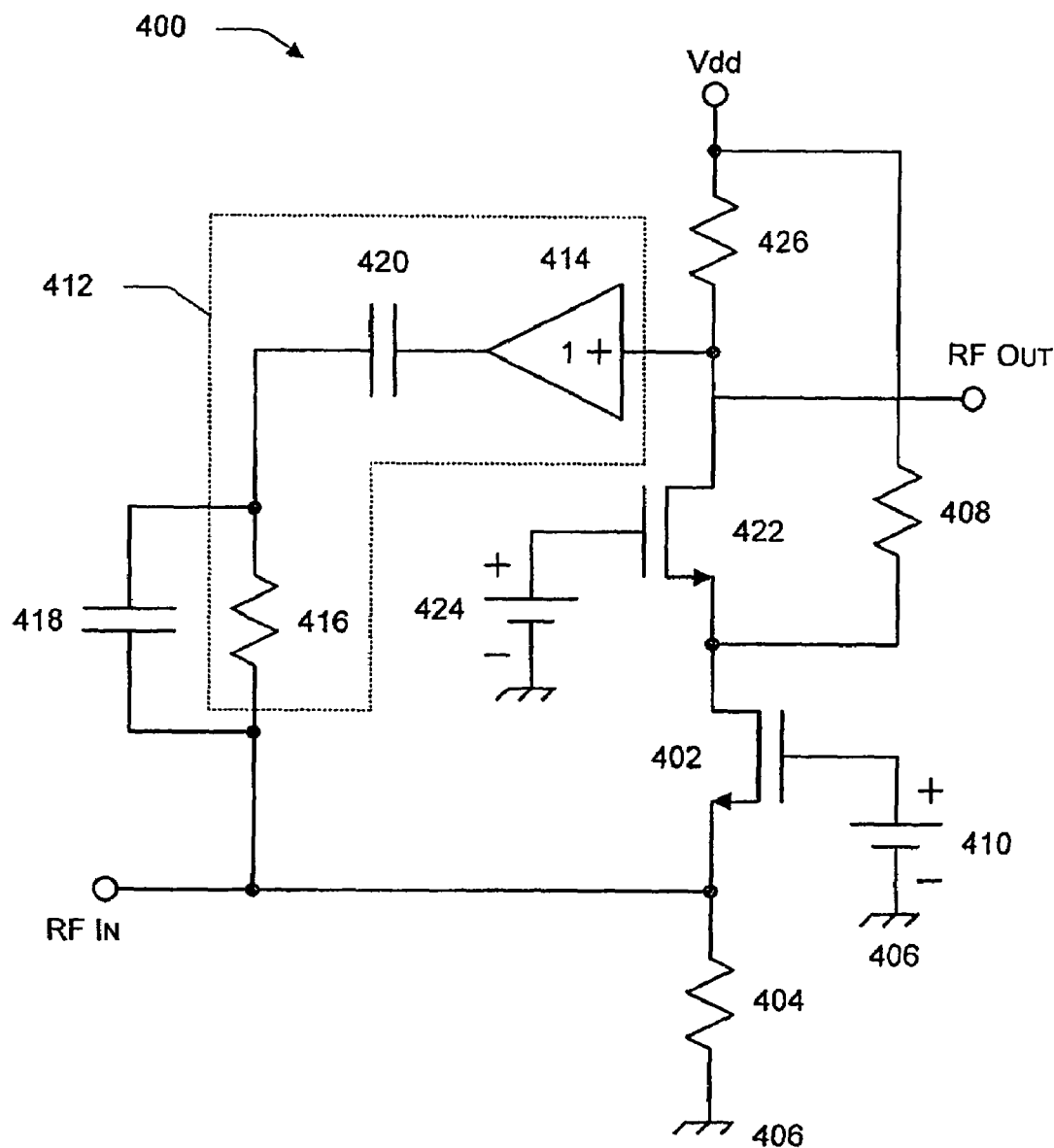
FIG. 4 is a circuit diagram illustrating a second implementation of a common-gate LNA circuit.

FIG. 4 illustrates a second implementation of a common-gate Low Noise Amplifier (LNA) circuit 400. Similar to the common-gate LNA 300, the common-gate LNA 400 may be implemented and fabricated as an integrated circuit using CMOS techniques, or other related implementation and fabrication techniques.

The common-gate LNA 400 includes a transistor 402 having a gate, drain and source. An input RF signal (RF In) is applied to the source of the transistor 402 resistor 404 is connected between the source of the transistor 402 and ground 406. Another resistor 408 is connected between a voltage source Vdd and the drain of the transistor 402. A biasing voltage source 410 is connected to the gate of the transistor 402.

Similar to the implementation of FIG. 3, the LNA 400 further includes a feedback section 412 connected between the drain of the second transistor 422 and the source of the first transistor 402. The feedback section 312 provides for high voltage gain and a low NF for specific frequencies of operation. The common-gate LNA 400 provides improved linearity and gain controllability and is formed without the use of inductors.

The feedback section 412 includes a buffer 414 and a resistor 416, which embody a resistive portion of the feedback section 412, thereby enabling the common-gate LNA 400 to provide substantially high gain (e.g., greater than 25 dB) and very reasonable input and output matching characteristics. A capacitor 418 may optionally be placed in parallel with the resistor 416 of the resistive portion of the feedback section 412. The capacitor 418 is used to compensate for undesirable capacitance associated with the transistors 402 and 422 (introduced below).

The feedback section 412 also includes an optional DC blocking component. In one implementation, the DC block component is implemented as a capacitor 420 having a first terminal connected to the buffer 414 and a second terminal connected to the resistor 416. A combination of one or more other devices may be used to implement the DC blocking component of the feedback section 412.

LNA 400 further includes a second transistor 422, which is provided to further increase the gain. The transistor 422 has a gate coupled to a biasing voltage source 424, a drain connected to the voltage source Vdd through a resistor 426, and a source coupled to the drain of the first transistor 402.

An output RF signal (RF Out) is drawn from the drain of the second transistor 422. Similar to the implementation above, an input impedance $R_{in}$ can be set to 50Ω by choosing $$g_m\left(1-\frac{R_L}{R_f}\right) \cong 50\Omega,$$

where $R_L$ is the resistor 426, $R_f$ is the resistor 416 and $g_m$ is the transconductance of transistor 402. For this example, one suitable ratio $$\frac{R_L}{R_f} \cong 0.6,$$

although the value of the indicated ratio may fall in the range of 0.4 to 0.8. Typically, the buffer 414 is a source-follower circuit with a voltage gain of 0.7 to 1. Implementing the common-gate LNA 400 in the described manner will provide a low NF with high linearity and low sensitivity. Moreover, unlike known conventional LNA configurations, the common-gate LNA 400 illustrated in FIG. 4 provides a good input match without sacrificing the NF and linearity, and eliminates the use of inductors.

Example Radio System

Figure 5:
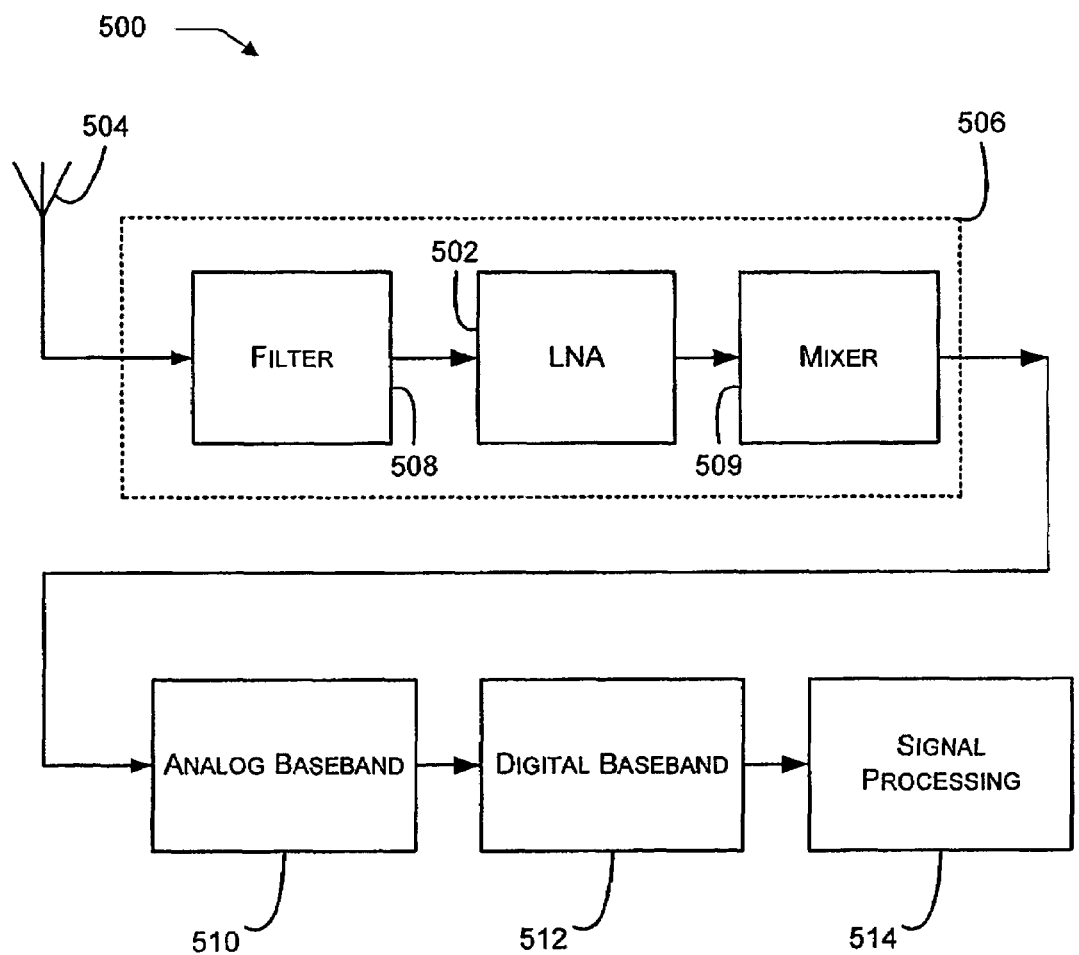
FIG. 5 is a block diagram showing a example radio system employing an LNA, such as the LNAs illustrated in FIGS. 3 and 4.

FIG. 5 illustrates an example radio system 500 that employs an LNA 502, which may be implemented as the LNAs 300 and 400 described above with reference to FIGS. 3 and 4, respectively. The radio system 500 may be part of a wireless communication device, such as a wireless telephone, a wireless communication device/card for use with a computing device, or the like.

The radio system 500 includes an antenna 504 coupled to a radio front end component 506. The antenna 504 receives a RF input signal and transmits the RF input signal to the radio front end component 506. The radio front end component 506 includes the LNA 502, which is configured to amplify the RF input signal to a desired level. For example, the LNA 502 may be configured in a manner as illustrated and described in FIGS. 3-4.

The front end 506 may also include one or more filters 508. It is to be appreciated that many variations and configurations in radio front end processing exist and that the LNA 502 can be utilized in any such variation and configuration. In the illustrated implementation, the LNA 502 follows the filter 508, which is connected to the antenna 504. In some cases, there may be an additional filter following the LNA 502. The front end 506 may further include a mixer 509 to down convert the RF signal to an intermediate frequency or baseband. In FIG. 5, the mixer 509 down converts the RF signal to baseband.

The mixer 509 of front end 506 is coupled to an analog baseband section 510. The analog baseband section 510 provides variable gain and filtering, and may optionally perform analog to digital (A/D) conversion. The output of the analog baseband section 510 may therefore be in a digital format for processing by the digital baseband section 512.

The digital baseband section 512 is programmed and/or configured to process the intermediate or baseband signal from the analog baseband section 510. If A/D conversion was not performed in the analog baseband section 510, the digital baseband section 512 may include A/D conversion as well as additional filtering. It is to be appreciated that such filtering may be implemented in the analog baseband section 510 (prior to conversion) or in the digital baseband section 512 (post conversion). The digital baseband section 512 may also perform appropriate demodulation of the signal. The digital baseband section 512 provides processed digital signal to a signal processor 514 for final processing (e.g., decoding, data extraction, and the like) and use by a user/entity utilizing the radio 500.

Those skilled in the art will understand and appreciate other configurations of radio systems (or portions thereof) that may utilize an LNA described herein to amplify a RF signal with a low noise figure.

Operation

The following discussion describes low noise amplification techniques that may be implemented utilizing the previously described devices and system, as well as in other systems and devices. Aspects of the procedures may also be implemented in hardware, firmware, or software, or a combination thereof. The procedures are shown as a set of blocks that specify operations performed by one or more devices and are not necessarily limited to the order shown for performing the operations by the respective blocks. In portions of the following discussion, reference will be made to the components of FIGS. 3-5.

Figure 6:
FIG. 6 is a flow diagram depicting an example procedure for amplifying a radio frequency signal from a source using a LNA, such as the LNAs illustrated in FIGS. 3 and 4.

FIG. 6 shows an example procedure 600 for amplifying an RF signal using an LNA, such as LNAs 300 and/or 400. The LNA may be part of a radio system, such as the radio system 500, or another system or device requiring the amplification of an electrical signal with minimum added noise.

At block 602, the RF signal is received. The RF may be received by the LNA by way of an antenna, or other similar signal carrying medium. At block 604, the received RF signal is fed back to normalize an input impedance. A feedback section (e.g., feedback sections 312 and 314) may be part of the LNA and may be coupled to at least one transistor (e.g., transistor 302), or alternatively two transistors (e.g., transistors 402 and 422). The feedback section includes a resistive portion and a DC blocking component, and is configured to ensure the LNA has a desired gain at a given frequency range. The feedback section also provides for input matching.

At block 606, the RF signal is amplified. The one or more transistors (e.g., transistor 302, or transistors 402 and 422) are biased with a biasing voltage and supplies an amplified RF output signal. The single transistor configuration provides an amplified RF output signal that has a gain of approximately 15-20 dB, and the dual transistor configuration provides an amplified output signal that has a gain.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims.

What is claimed is:

1. A Low Noise Amplifier (LNA) circuit, comprising:
  a transistor; and
  a feedback section coupled to the transistor, the feedback section having a resistive portion including at least a buffer and a resistor; and
  a capacitor connected in parallel with the resistor of the feedback section.

2. The LNA circuit according to claim 1, wherein the feedback section is connected between a drain and a source of the transistor.

3. The LNA circuit according to claim 1, wherein the buffer is connected to a drain of the transistor and the resistor is connected to a source of the transistor.

4. The LNA circuit according to claim 1, wherein the transistor and the feedback section are arranged to provide an input impedance of a predetermined value.

5. The LNA circuit according to claim 1, wherein the feedback section includes a DC blocking component.

6. The LNA circuit according to claim 5, wherein the DC blocking component comprises a capacitor, the capacitor having a terminal connected to the buffer and another terminal connected to the resistor.

7. The LNA circuit according to claim 1, further comprising:
an input capable of receiving a signal, the input connected to a source of the transistor; and
an output capable of outputting a signal, the output connected to a drain of the transistor.

8. The LNA circuit according to claim 1, wherein a gate of the transistor is connected to a biasing voltage source.

9. A Low Noise Amplifier (LNA) circuit, comprising:
a transistor; and
a feedback section coupled to the transistor, the feedback section having a resistive portion including at least a buffer and a first resistor; and
a second resistor connected between around and a source of the transistor; and
a third resistor connected between a voltage source and a drain of the transistor,
wherein an input impedance can be set to a predetermined value by choosing a ratio of the second resistor to the first resistor, wherein the ratio falls in the range of 0.4 to 0.8.

10. A Low Noise Amplifier (LNA) circuit, comprising:
a first transistor;
a feedback section coupled to the transistor, the feedback section having a resistive portion including at least a buffer and a resistor; and
a second transistor having a source connected to a drain of the first transistor.

11. The LNA circuit according to claim 10, wherein the buffer is connected to a drain of the second transistor and the resistor is connected to a source of the first transistor.

12. The LNA circuit according to claim 10, further comprising a capacitor, the capacitor having a terminal connected to the buffer and another terminal connected to the resistor.

13. The LNA circuit according to claim 10, further comprising:
an input capable of receiving a signal, the input connected to a source of the first transistor; and
an output capable of outputting a signal, the output connected to a drain of the second transistor.

14. The LNA circuit according to claim 10, further comprising a capacitor connected in parallel with the resistor of the feedback section.

15. The circuit according to claim 10, wherein the resistor is a first resistor, and further comprising:
a second resistor connected to a drain of the first transistor and a voltage source;
a third resistor connected to a drain of the second transistor and the voltage source; and
a fourth resistor connected to a source of the second transistor and ground.

16. The LNA circuit according to claim 15, wherein an input impedance can be set to a predetermined value by choosing a ratio of the third resistor to the first resistor, wherein the ratio falls in the range of 0.4 to 0.8.

17. An integrated circuit, comprising:
first and second transistors, a drain of the first transistor connected to a source of the second transistor; and
a feedback section coupled across the first and second transistors, the feedback section including a buffer, a resistor and a capacitor connected in a series configuration, wherein a terminal of the buffer is connected to a drain of the second transistor and a terminal of the resistor is connected to a source of the first transistor.

18. The integrated circuit according to claim 17, further comprising:
an input capable of receiving a radio frequency (RF) signal and connected to the source of the first transistor; and
an output capable of supplying an RF signal and connected to the drain of the second transistor.

19. The integrated circuit according to claim 17, further comprising:
a voltage source connected to drains of the first and second transistors; and
at least one biasing voltage source connected to gates of the first and second transistors.

20. A system, comprising:
an antenna capable of receiving a radio frequency (RF) signal; and
the integrated circuit according to claim 17 configured to receive the RF signal from the antenna and amplify the RF signal.

21. A radio system, comprising:
an antenna capable of receiving a radio frequency (RF) signal;
a front end to receive the RF signal from the antenna and amplify the RF signal, the front end having a first transistor and a feedback section arranged to provide an input impedance of a predetermined value;
one or more processing modules to process the RF signal;
a second transistor having a source connected to a drain of the first transistor; and
the feedback section is connected between a drain of the second transistor and a source of the first transistor.

22. The radio system according to claim 21, wherein the feedback section is coupled between a source and a drain of the transistor.

23. The radio system according to claim 21, wherein the feedback section comprises a buffer and a resistor.

24. The radio system according to claim 21, wherein the feedback section comprises a buffer, a resistor, and a DC blocking component connected in series between a drain and a source of the transistor.

25. A method, comprising:
receiving a radio frequency (RF) signal; and
passing the received RF signal through a feedback section of a Low Noise Amplifier (LNA) the feedback section coupled to at least one biased transistor, the feedback section having a resistive portion and a DC blocking component and configured to provide the LNA with a desired gain over a given frequency range;
biasing a gate of the transistor with a biasing voltage; and
supplying an amplified RF output signal from a drain of the transistor, wherein the amplified RF output signal has a gain of approximately 15-20 dB.

* * * * *